(12) United States Patent
Ruckerbauer et al.

(10) Patent No.: US 8,547,767 B2
(45) Date of Patent: Oct. 1, 2013

(54) CHIP, MULTI-CHIP SYSTEM IN A METHOD FOR PERFORMING A REFRESH OF A MEMORY ARRAY

(75) Inventors: Hermann Ruckerbauer, Moos (DE); Dominique Savignac, Ismaning (DE)

(73) Assignee: Qimonda AG, Munich (DE)

( * ) Notice: Subject to any disclaimer, the term of this patent is extended or adjusted under 35 U.S.C. 154(b) by 944 days.

(21) Appl. No.: 12/108,383

(22) Filed: Apr. 23, 2008

(65) Prior Publication Data

US 2009/0268539 A1 Oct. 29, 2009

(51) Int. Cl.
*G11C 11/406* (2006.01)
*G11C 11/4076* (2006.01)

(52) U.S. Cl.
USPC .............. 365/222; 365/230.03; 711/106

(58) Field of Classification Search
USPC .................... 365/222, 230.03; 711/106
See application file for complete search history.

(56) References Cited

U.S. PATENT DOCUMENTS

| 5,629,897 | A * | 5/1997 | Iwamoto et al. ............. 365/222 |
| 2004/0184337 | A1 * | 9/2004 | Jakobs ..................... 365/222 |
| 2005/0286286 | A1 * | 12/2005 | Saito et al. .................. 365/63 |
| 2009/0039915 | A1 | 2/2009 | Ruckerbauer et al. |

OTHER PUBLICATIONS

"JEDEC Standard: DDR3 SDRAM Standard," JEDEC Solid State Technology Association, JESD79-3, Jun. 2007, 179 pages, JEDEC Engineering Standards and Publications, Arlington, VA.

* cited by examiner

*Primary Examiner* — J. H. Hur
(74) *Attorney, Agent, or Firm* — John S. Economou

(57) ABSTRACT

A chip includes a memory array and a refresh counter. The refresh counter is configured to receive refresh trigger signals. The refresh counter is configured or configurable to initiate a refresh of the memory array only once per i of the received refresh trigger signals where i is a number greater than 1.

22 Claims, 9 Drawing Sheets

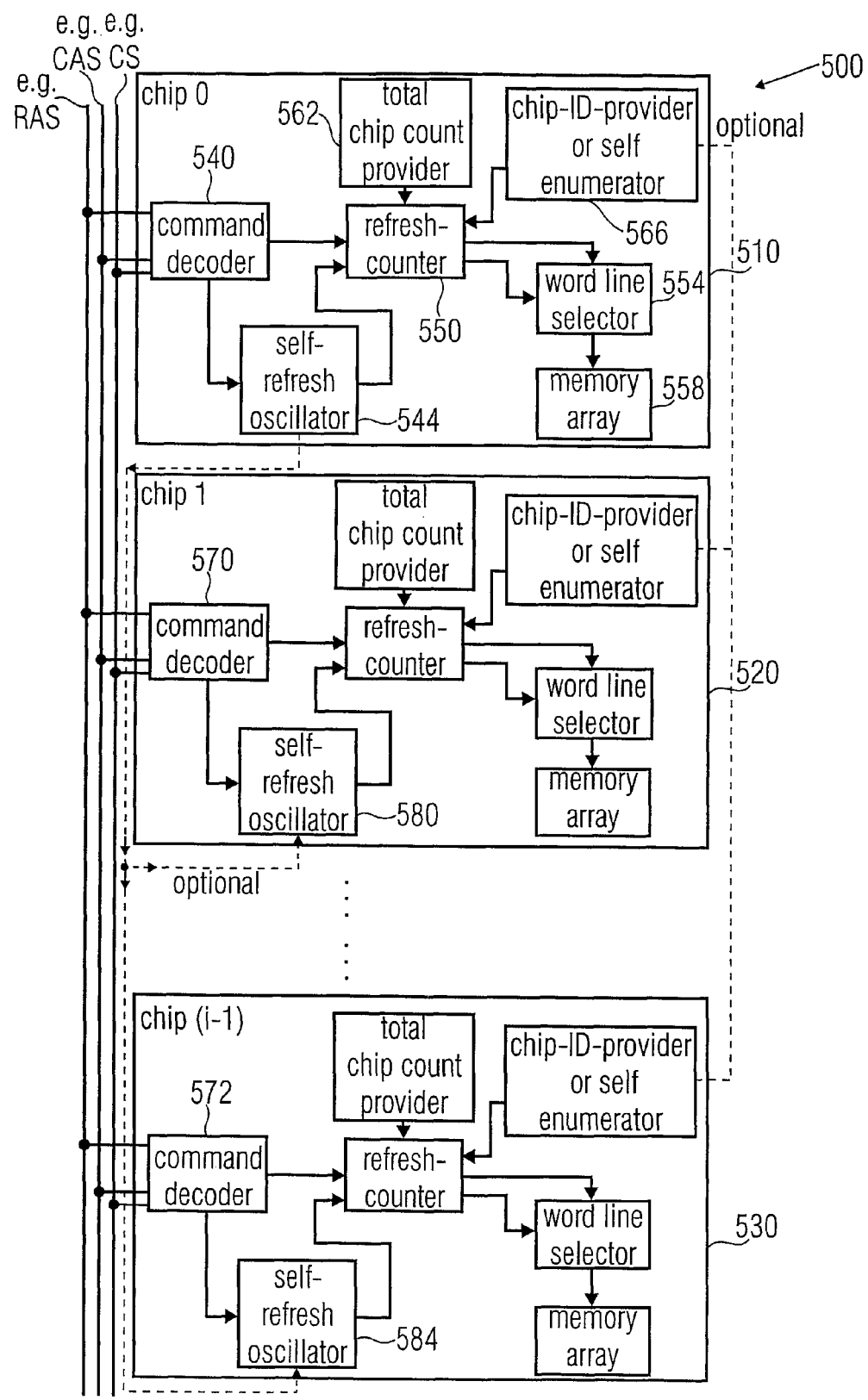

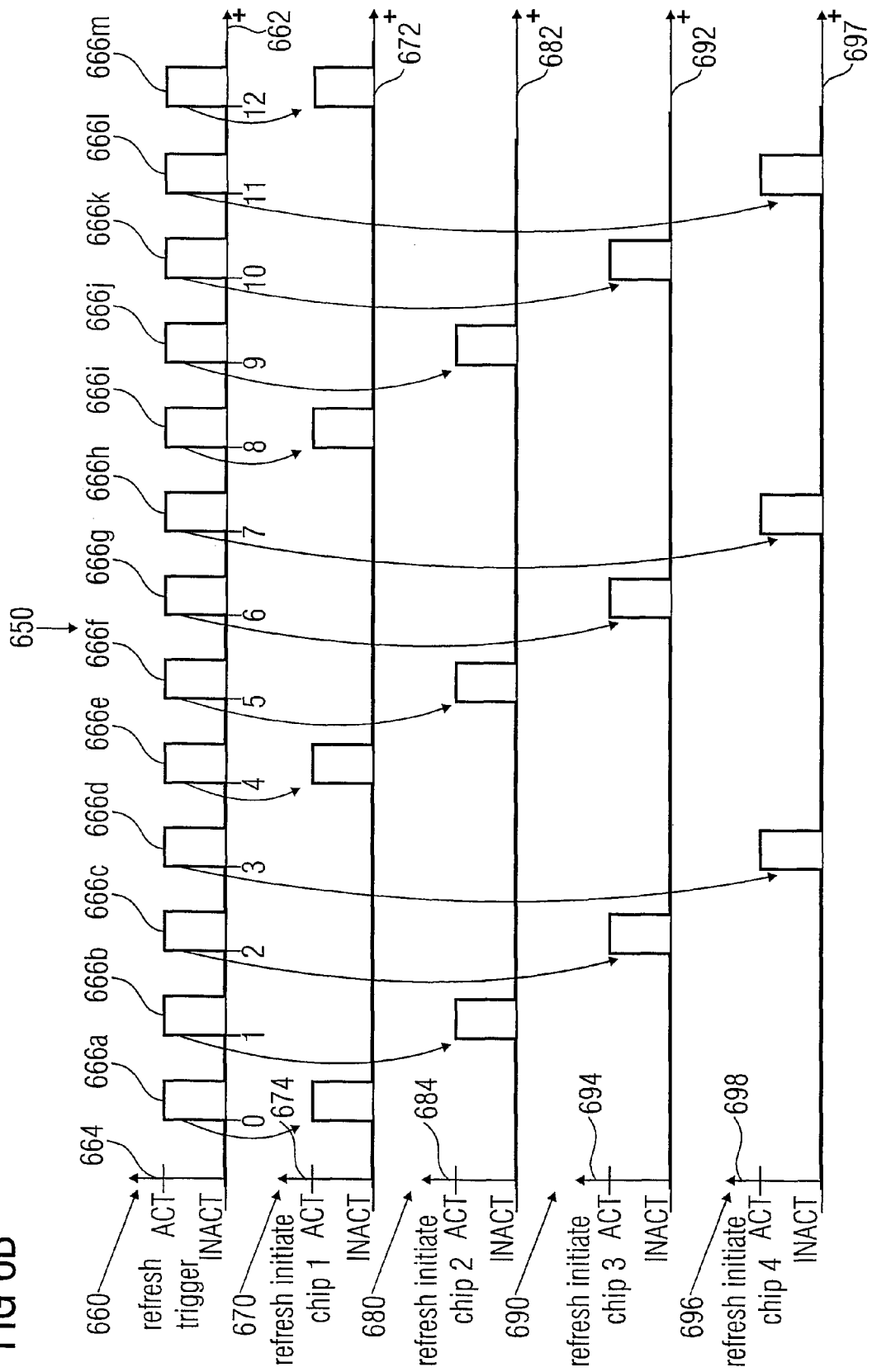

CHIP, MULTI-CHIP SYSTEM IN A METHOD FOR PERFORMING A REFRESH OF A MEMORY ARRAY

TECHNICAL FIELD

Several embodiments described herein relate to a chip, a multi-chip system and a method for performing a refresh of a memory array.

BRIEF DESCRIPTION OF THE DRAWINGS

FIG. 5 shows a block schematic diagram of a multi-chip system, according to an embodiment;

FIG. 6b shows a graphical representation of signals, which may be present in a multi-chip system according to an embodiment;

DETAILED DESCRIPTION OF ILLUSTRATIVE EMBODIMENTS

Figure 1:
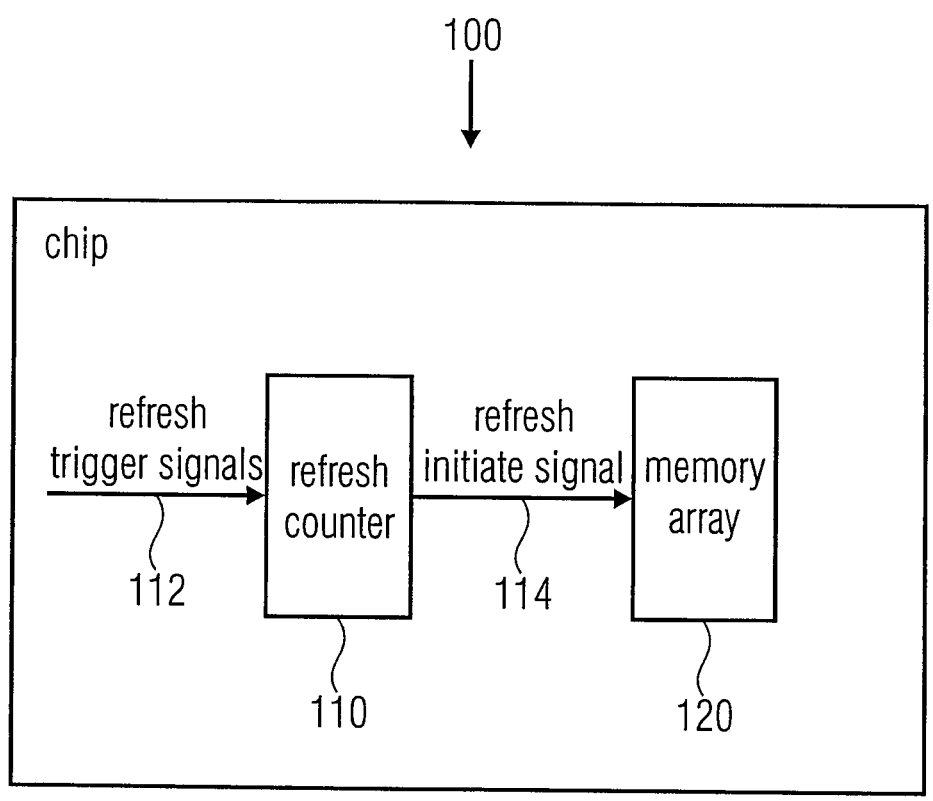
FIG. 1 shows a block schematic diagram of a chip, according to an embodiment.

FIG. 1 shows a block schematic diagram of a chip, according to an embodiment. The chip shown in FIG. 1 is designated in its entirety with 100. The chip 100 comprises a refresh counter 110 and a memory array 120. The refresh counter is configured to receive refresh trigger signals 112. Moreover, the refresh counter 110 is configured or configurable to initiate a refresh of the memory array 120 only once per i of the received refresh trigger signals 112. For example, the refresh counter 110 may provide a refresh initiate signal 114 to the memory array 120 to initiate a refresh of the memory array 120. It should be noted here that i is a number greater than 1. In some embodiments, the number i may be programmable.

Some embodiments of the present invention are based on the finding that it may be desirable to reduce a refresh activity of a memory array (for example, of the memory array 120) compared to a refresh activity indicated by refresh trigger signals 112. For example, there are some circumstances under which an internal or external refresh trigger signal provider (which may or may not be part of an embodiment of the invention) provides the refresh trigger signals 112 more frequently than required to properly refresh the memory array 120. In this case, the refresh counter 110 may, for example, initiate an actual refresh of the memory array 120 only once per i of the refresh trigger signals, wherein i is greater than one. Thus, a frequency of refresh events of the memory array 120 may in an embodiment be reduced when compared to the frequency of refresh trigger events described by the refresh trigger signals 112.

Consequently, the refresh counter 110 may, for example, provide an adaptation between a rate of refresh events described by the refresh trigger signals 112 and an actual memory array refresh rate at which the memory array 120 is actually refreshed (e.g., a rate at which subsequent refresh events of the memory array are initiated).

In some embodiments, the refresh counter 110 may thus provide the possibility to use the chip 100 in an environment in which a rate of refresh trigger events described by the refresh trigger signals 112 is not matched with an optimal refresh rate (e.g., a rate at which the memory array 120 should actually be refreshed, or a rate at which subsequently refreshed memory rows should be refreshed).

The above-described adaptation of the actual refresh rate (for example, defined as an inverse of a time interval between two subsequent refresh operations performed on the memory array, or defined as an inverse of a time interval between a refresh of a first memory row and a subsequent refresh of a second memory row), which may be achieved by initiating a refresh of the memory array only once per i of the received refresh trigger signals, may, for example, be used in a system in which there are several memory chips, connected together to receive refresh trigger signals 112 such that refresh trigger signals provided to each of the connected memory chips are substantially identical. However, the above described adaptation of the actual refresh rate may naturally also be used in a wide variety of different system environments, even in a system comprising only a single memory chip.

There may in some embodiments be one or more chips with an internal refresh rate (for example, a desirable refresh rate of a memory array) different from the internal refresh rate (for example, a desirable refresh rate of a memory array) of other chips. In such an environment, some embodiments of the refresh counter described herein may be used.

In some embodiments, an appropriate refresh rate can be ensured for each of the chips by allowing to set an actual memory array refresh rate to a value which is a fraction of a refresh rate described by the refresh trigger signals 112.

Also, there are some embodiments in which a plurality of identical chips 100 are combined, and are all operated with refresh trigger signals 112 of identical rate.

If multiple chips (for example, multiple of the chips 100) are combined, for example, to form a larger memory, the combination of the multiple chips may appear from the outside like a single large memory. A memory controller (which may or may not be part of an embodiment) may, for example, be configured to adapt the refresh rate in dependence on the size of the memory (for example, in dependence on the total memory size or overall memory capacity of a memory comprising multiple chips). In other words, the memory controller may, for example, be configured to adjust a refresh rate (e.g., a number of refresh trigger signals per time unit) to the total memory size. Thus, in some embodiments, the memory controller would possibly provide refresh trigger signals at an increased rate (or frequency) in the presence of a higher capacity memory formed by a plurality of chips when compared to the case of a lower capacity memory formed by a single of the chips.

In this case, if all the chips forming the higher capacity memory (comprising multiple of the chips) would receive identical refresh trigger signals having increased frequency, a refresh rate of the actual memory arrays (e.g., the memory array 120) of the chips would be unnecessarily increased, thus resulting, for example, in an unnecessarily high power consumption.

Thus, in an embodiment where several of the chips 100 are combined, for example, in order to obtain larger total memory, a rate of actual refresh events of the individual memory arrays 120 of the individual chips 100 may be reduced when compared to a rate of refresh trigger events described by the refresh trigger signals 112. In some embodiments, this may possibly contribute to a reduction of an overall power consumption.

Also, in some embodiments, a reduced number of actual refresh events performed on the memory array 120 when compared to a rate of refresh trigger events described by the refresh trigger signals 112 may provide an additional degree of freedom in the design of any system.

In the following, further details of some embodiments will be described. In some embodiments, some or all of the features mentioned in the following may be implemented. However, the features described below should naturally be considered optional.

Figure 2:
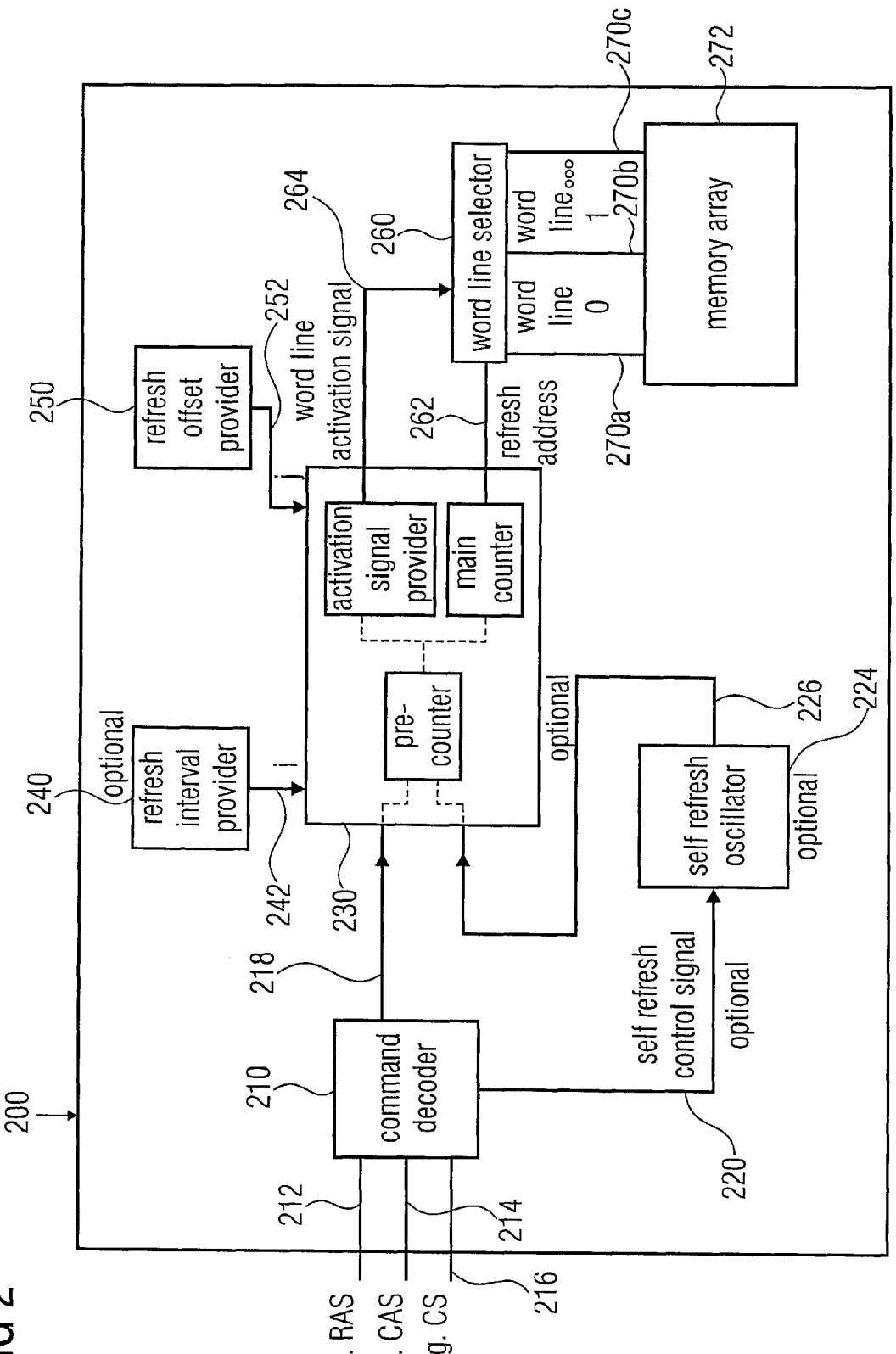
FIG. 2 shows a block schematic diagram of a chip, according to another embodiment.

FIG. 2 shows a block schematic diagram of a chip, according to another embodiment. The chip shown in FIG. 2 is designated in its entirety with 200. The chip 200 comprises a command decoder 210. The command decoder 210 may, for example, be configured to receive one or more command signals capable of encoding different commands. In the embodiment shown in FIG. 2, the command decoder 210 may be configured to receive three command signals 212, 214, 216, which are capable of encoding different commands. For example, the command decoder 210 may be configured to receive a row address strobe signal or row address select signal 212, which may also be designated with "RAS". Moreover, the command decoder 210 may be configured to receive a column address strobe signal or column address select signal 214, which may also be designated with "CAS".

In addition, the command decoder 210 may, for example, receive a chip select signal 216, which may also be designated with "CS". The row address select signal or row address strobe signal 212, the column address select signal or column address strobe signal 214 and/or the chip select signal 216 may, for example, be defined as described in any of the well-known JEDEC specifications for memory chips. However, the command decoder 210 may also be configured to receive only one or two out of the shown command signals 212, 214, 216, or may be configured to receive other or additional command signals.

The command decoder 210 is further configured to identify whether the one or more command signals 212, 214, 216 encode a refresh command. Also, the command decoder 210 may be configured to provide a refresh trigger signal 218 in response to a detection of a refresh command encoded by the command signals.

The command decoder 210 may optionally be configured to provide a self-refresh control signal 220. The command decoder 210 may, for example, be configured to provide the optional self refresh control signal 220 if the one or more command signals indicate that a self refresh mode shall be entered or activated.

The chip 200 may optionally comprise a self-refresh oscillator 224. The self-refresh oscillator 224 may, for example, be configured to receive the self-refresh control signal 220 from the command decoder 210 (or from any other means). However, the self-refresh oscillator 224 may also, alternatively, receive a different control signal. In another embodiment, the self-refresh oscillator 224 may be configured to be operational without receiving any control signal.

The self-refresh oscillator 224 may further be configured to provide refresh trigger signals 226, for example based on a free-running oscillator or based on a clock signal provided to the self-refresh-oscillator.

The refresh oscillator 224 may, for example, be turned on and turned off in dependence on whether a self refresh is desired or not. Alternatively, the provision of the refresh trigger signals 226 may be interrupted while the self-refresh oscillator is actually running.

The chip 200 comprises a refresh counter 230, which may be configured to receive refresh trigger signals 218 from the command decoder 210. Optionally, the refresh counter 230 may also be configured to receive the refresh trigger signals 226 from the self-refresh oscillator 224.

Details regarding the refresh counter 230 will be explained below.

Optionally, the chip 200 may comprise a refresh interval provider 240. The refresh interval provider 240 may be coupled to the refresh counter 230 to provide a refresh interval information 242 to the refresh counter 230. The refresh interval information 242 may, for example, describe a number, which may, for example, characterize a refresh interval. The number may be designated, for example, with i.

The chip 200 may further, optionally, comprise a refresh offset provider 250. The refresh offset provider 250 may, for example, be coupled with the refresh counter 230 to provide to the refresh counter 230 a refresh offset information 252. The refresh offset information 252 may for example describe a timing at which a refresh is performed. The refresh offset information 252 may, for example, comprise a description of a number, which may be designated by a variable j. The meaning of the refresh offset information will be discussed in detail below.

The chip 200 may, in an embodiment, comprise a word line selector 260. The word line selector or word line decoder 260 may, for example, be coupled to the refresh counter 230 to receive from the refresh counter, refresh address information 262. The refresh address information 262 may, for example, describe, in an encoded form, an address of a memory cell or memory portion (e.g., a memory row) to be refreshed. For example, the refresh address information 262 may describe a memory row to be refreshed. The word line selector 260 may be configured to receive from the refresh counter 230 a word line activation signal 264 (or a plurality of word line activation signals). The word line activation signal 264 may, for example, signal that a refresh is actually to be performed, for example, by activating a word line (and possibly a read amplifier). In other words, the word line selector 260 may, for example, activate at least one out of a plurality of word lines 270a, 270b, 270c of a memory array 272 in response to an activation of the word line activation signal 264. In other words, in an embodiment the word line selector 260 may be configured to activate at least one out of the plurality of word lines 270a, 270b, 270c each time the word line activation signal 264 is activated.

In the following, the operation of the chip 200 will be described in detail. In particular, the interaction of the individual components of the chip 200 will be described. Also, details regarding the operation of the refresh counter 230 will be given.

In an embodiment, the refresh counter 230 may be configured to receive refresh trigger signals 218, 226 from one or more sources. The refresh counter 230 may, for example, be configured to receive refresh trigger signals either from the command decoder 210, or from the self-refresh oscillator 224. In an embodiment, the chip 200 may be operated such that refresh trigger signals are provided, in a certain time interval, either by the command decoder 210 or by the self-refresh oscillator 224. However, there may be some embodiments in which the refresh counter 230 receives refresh trigger signals 218, 226 both from the command decoder 210 and from the self-refresh oscillator 224.

The refresh counter 230 may further be configured to control or initiate an actual refresh process. For this purpose, the refresh counter 230 may be configured to provide the refresh address information 262 to the word line selector 260. Moreover, the refresh counter 230 may be configured to initiate an actual refresh process (e.g., an activation of a word line 270a-270c of the memory array 272) by activating the word line activation signal 264.

The refresh counter 230 may, for example, fulfill the functionalities described with respect to the refresh counter 110.

The refresh counter 230 may, for example, be configured to initiate an actual refresh process, e.g., to provide an active word line activation signal, only once per i of the refresh trigger signals 218, 226 received from the command decoder 210 and/or the self-refresh oscillator 224. In other words, the refresh counter may, for example, be configured to generate word line activation signals 264 such that an activation rate of the word line activation signals 264 is 1/i of an activation rate of the refresh trigger signals 218, 226 received by the refresh counter 230.

It should be considered that the refresh counter 230 may, for example, actually select one source for the refresh trigger signals, such that the activation rate of the word line activation signals 264 is 1/i of the activation rate of the refresh trigger signals of the selected source of the refresh trigger signals.

For the sake of flexibility, and for being able to use the chip 200 in different configurations, the refresh counter 230 may, in some embodiments, be configurable or programmable to adjust a ratio between the activation rate of the word line activation signals 264 and the activation rate of the refresh trigger signals from the selected source of refresh trigger signals in dependence on the refresh interval information 242 provided by the optional refresh interval provider 240. However, in different embodiments, the ratio may be mask programmed, one-time programmable, reprogrammable or hardwired.

The refresh counter 230 may optionally be configured to adjust different timings (or different timing relationships, for example, different time shifts) of the activation of the word line activation signals 264, for example, relative to a reset signal. For example, if the refresh trigger signals received or processed by the refresh counter 230 are counted from an arbitrary trigger event or from an arbitrary timing reference, the refresh counter may optionally be configurable to adjust, whether the word line activation signal is actually activated in (immediate) response to the m-th refresh trigger signal, or in response to the (m+1)-th refresh trigger signal, or in response to the (m+2)-th refresh trigger signal, and so one.

In some embodiments, this temporal fine-tuning of the time at which the word line activation signal 264 is activated (e.g., by shifting the activation time of the word line activation signal 264 by one or more activations of the refresh trigger signals 218, 226, for example, relative to a reset time or a timing reference) may, for example, be based on the refresh offset information 252 provided by the refresh offset provider 250.

In the following, it will be assumed that the refresh trigger signals 218, 226 received and/or processed by the refresh counter 230 are numbered with subsequent integer numbers p. A reference time t=0 is chosen, which may coincide with a certain event, for example, a power-up event or a reset event (e.g., an activation of a certain reset signal, a completion of a configuration process, or another event). Thus, the refresh counter 230 may be configured to activate the word line activation signal 264 in response to refresh trigger signals having indices $t_{actual\_refresh}$, wherein the following relationship may hold:

$$t_{actual\_refresh}(n) = 0 + (i \cdot n + j)$$

In the above equation, $t_{actual\_refresh}$ (n) designates a time index of a n-th refresh of a memory array of a chip. In other words, a n-th refresh of the memory array of a given chip may be performed n response to a $t_{actual\_refresh}$ (n)-th refresh trigger signal. The variable n designates an integer variable, which may take different values (0, 1, 2, ... ) to enumerate refresh events. The variable i designates a refresh period or refresh interval, wherein an active word line activation signal 264 is provided once per i of the refresh trigger signals 218, 226 processed by the refresh counter 230. The variable j describes a timing fine adjustment. The variable j may, for example, take an integer value, for example, in a range between 0 and (i−1), including 0 and (i−1). However, the variable j may naturally be chosen differently to obtain a time shift.

In an embodiment, the refresh counter 230 may be configured such that both the refresh interval (described, for example, by the variable i) and the refresh offset (described, for example, by the variable j) are adjustable. In other words, the refresh counter 230 may be configured such that the refresh counter can be set to at least two different refresh intervals, for example, in dependence on the refresh interval information 242. In an embodiment, the refresh counter 230 may also be configured such that the refresh offset, i.e., a timing shift of the word line activation signal 264, can be set to at least two values, for example, in dependence on the refresh offset information 252.

The refresh counter 230 may, for example, be configured to provide the refresh address information 262. The refresh counter 230 may be configured to modify the refresh address information 262 once per activation of the word line activation signal 264. In an embodiment, for each actual refresh operation of the memory array 272, the refresh counter 230 first updates (e.g., increases or decreases) the refresh address information 262 and then activates the word line activation signal 264. Naturally, a different order of these operations may also be used.

In the following, details regarding different components of embodiments of the chip 200 will be described.

Firstly, details regarding embodiments of the refresh counter 230 will be described with reference to the FIGS. 3a and 3b.

Figure 3A:
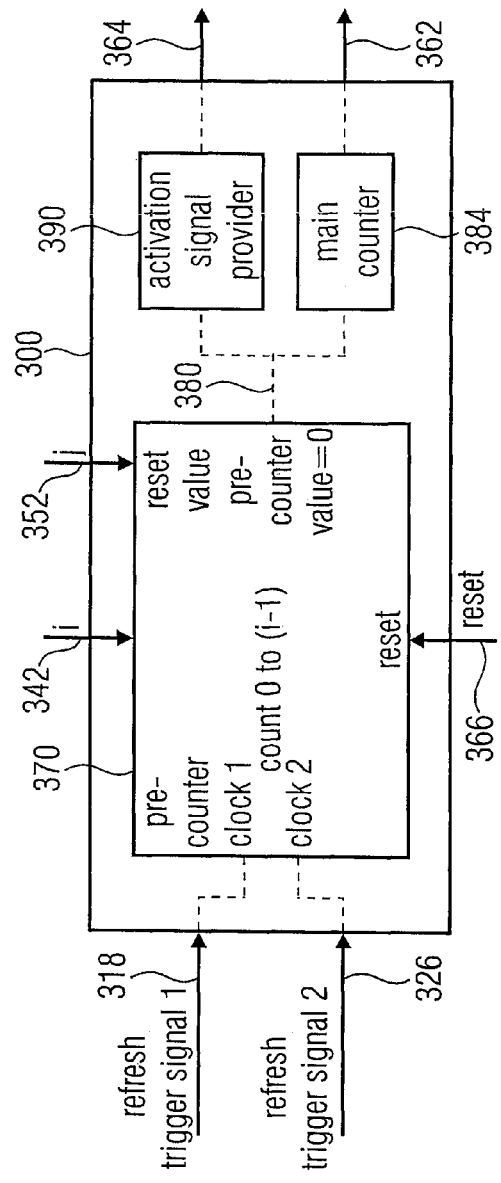
FIG. 3a shows a block schematic diagram of a refresh counter, according to an embodiment.

FIG. 3a shows a block schematic diagram of a refresh counter according to an embodiment of the invention. The refresh counter shown in FIG. 3a is designated in its entirety with 300.

The refresh counter 300 may, for example, be configured to receive first refresh trigger signals 318 and second refresh trigger signals 326. The first refresh trigger signals 318 may be identical to the refresh trigger signals 218 shown in FIG. 2. The second refresh trigger signals 326 may, for example, be identical to the refresh trigger signals 226 shown in FIG. 2. However, it should be noted that the refresh counter 300 may alternatively have only a single input for refresh trigger signals. The refresh counter 300 may further, optionally, comprise an input for refresh interval information 342, which may, for example, be identical to the refresh interval information 242. The refresh counter 300 may further, optionally, comprise an input for a refresh offset information 352, which may, for example, be identical to the refresh offset information 252. The refresh counter 300 may comprise an output for a refresh address information 362, which may be identical to the refresh address information 262, and an output for a word line activation signal 364, which may be identical to the word line activation signal 264. In addition, the refresh counter 300 may, optionally, comprise an input for a reset signal 366.

Thus, the refresh counter 300 may, for example, fulfill the functionality of the refresh counter 230 shown in FIG. 2, or of the refresh counter 110 shown in FIG. 1.

The refresh counter 300 may comprise a pre-counter 370, which may be configured to receive at a clock input at least one out of the first refresh trigger signals 318 and the second refresh trigger signals 326. For example, there may be a selection which of the refresh trigger signals 318, 326 actually serve as a clock for the pre-counter 370. Alternatively, for example, if it is ensured by the circuitry controlling the refresh counter 300, that the first refresh trigger signals 318 and the second refresh trigger signals 326 are not active at the same time, the pre-counter 370 may, for example, receive an OR combination of that signal as a clock. To summarize the above, the pre-counter 370 may be configured to be clocked by the first refresh trigger signals 318 and/or by the second refresh trigger signals 326.

The pre-counter 370 may, for example, be configured to count from 0 to (i−1), or from 1 to i. For example, the pre-counter 370 may be configured to increase or decrease a count value, also designated as pre-counter value, once per refresh trigger signal. In other words, the pre-counter 370 may be configured to modify the pre-counter value, for example by 1, in response to each pre-counter clock event (e.g., in response to each refresh trigger signal selected to reach the pre-counter clock input). It should be noted that this functionality of the pre-counter 370 is in some embodiments only fulfilled in a normal operation of the pre-counter 370. For example, if the pre-counter 370 is held in a "reset" state or in a "disabled" state, the pre-counter 370 may, for example, be stopped to maintain its current pre-counter value or to be set to a reset value.

The pre-counter 370 may, for example, comprise a binary upward counter or a binary downward counter. If a binary upward counter is used, the pre-counter 370 may, for example, be automatically set to 0, if a count value of i is reached. Alternatively, if a downward counter is used, the counter may be automatically set to a value of i, as soon as a counter value of 0 is reached. However, other implementations are naturally possible, which are well known for someone skilled in the art of designing electronic counters.

In an embodiment, the pre-counter 370 may, for example, be configured to be reset to a reset value in response to the activation of the reset signal 366. In this embodiment, the pre-counter 370 may be reset to the value described by the refresh offset information 352. In other words, the pre-counter 370 may be configured to be set to the value j upon activation of the reset signal 366. Thus, it can be reached that a reset value of the pre-counter 370 can be set different values. In this way, a timing of the signals provided by the refresh counter 300 can be adjusted or fine-tuned.

In some embodiments, the pre-counter 370 may be configured to provide an active pre-counter output signal 380 each time the pre-counter value of the pre-counter 370 reaches a certain, for example, predetermined, value. In an embodiment, the pre-counter 370 may be configured to provide an active pre-counter output signal 380 each time the pre-counter 370 reaches the pre-counter value 0. However, naturally other configurations could be chosen.

The refresh counter 300 further comprises a main counter 384, which may, for example, be configured to receive the pre-counter output signal 380 as a clock signal and to provide the refresh address information 362. The main counter 384 may, for example, be configured to increase or decrease (i.e., to modify) the refresh address information 362 each time that an active pre-counter output signal 380 is received from the pre-counter 370. However, there are naturally different options. For example, the main counter 384 may modify the refresh address information 362 in response to a rising edge of an active pre-counter output signal 380 or in response to a falling edge of an active pre-counter output signal 380.

The refresh counter 300 further comprises an activation signal provider 390. The activation signal provider 390 may, for example, be configured to receive the pre-counter output signal 380 and to provide the word line activation signal 364 in response to an active pre-counter output signal 380. The activation signal provider 390 may, for example, be configured to ensure a proper timing of the word line activation signal 364.

Figure 3B:
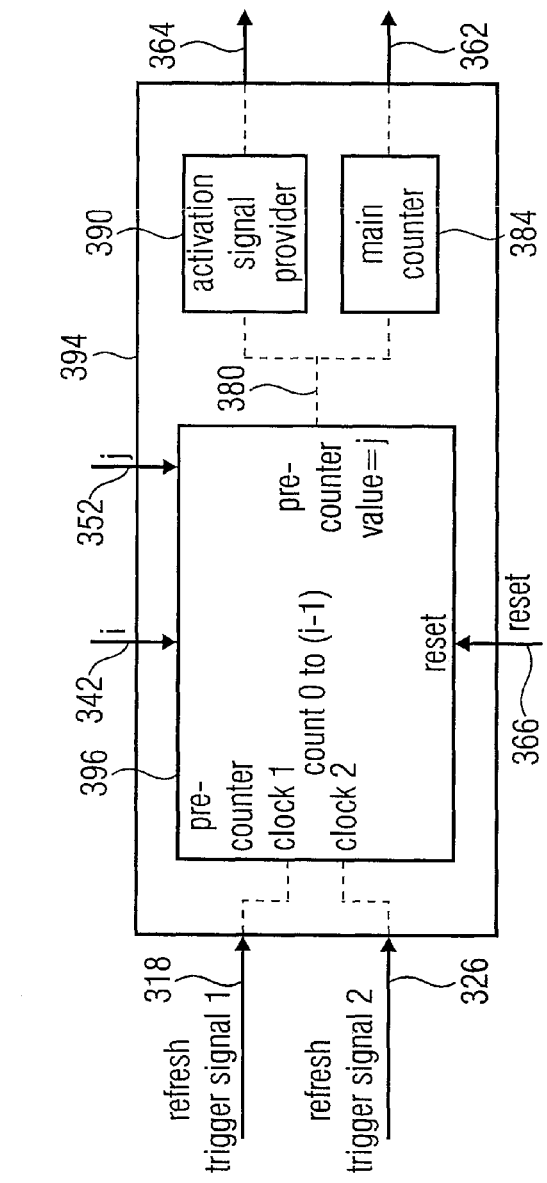
FIG. 3b shows a block schematic diagram of a refresh counter, according to another embodiment.

FIG. 3b shows a block schematic diagram of a refresh counter, according to another embodiment. The refresh counter shown in FIG. 3b is designated in its entirety with 394. The refresh counter 394 may be very similar to the refresh counter 300. Accordingly, identical means and signals are designated with identical reference numerals in FIGS. 3a and 3b. However, the refresh counter 394 may comprise a pre-counter 396, which may be modified when compared to the pre-counter 370. For example, the pre-counter 396 may be configured to be reset to the pre-counter count value of 0 by the activation of the reset signal 366. Thus, the pre-counter 396 may not comprise the functionality to be reset to a value j, which functionality may be provided by the pre-counter 370. On the other hand, the pre-counter 396 may be configured to activate the pre-counter output signal 380 when the pre-counter count value reaches the value of j, or another value which is dependent on the value of the refresh offset information 352. Thus, the refresh offset information 352 may have an effect to shift a timing of the pre-counter output signal 380 when compared to an activation of the reset signal 366.

To summarize the above, in different embodiments of the invention there may be different mechanisms to adjust the timing of the pre-counter output signal 380 (or fine-tune the timing). Consequently, there may be different mechanisms for adjusting or fine-tuning a timing of the word line activation signal 364. Some of these mechanisms may, for example, have the effect to determine, which out of a plurality of subsequent refresh trigger signals results in an actual refresh of the memory array, i.e., for example an actual activation of a word line.

Figure 4:
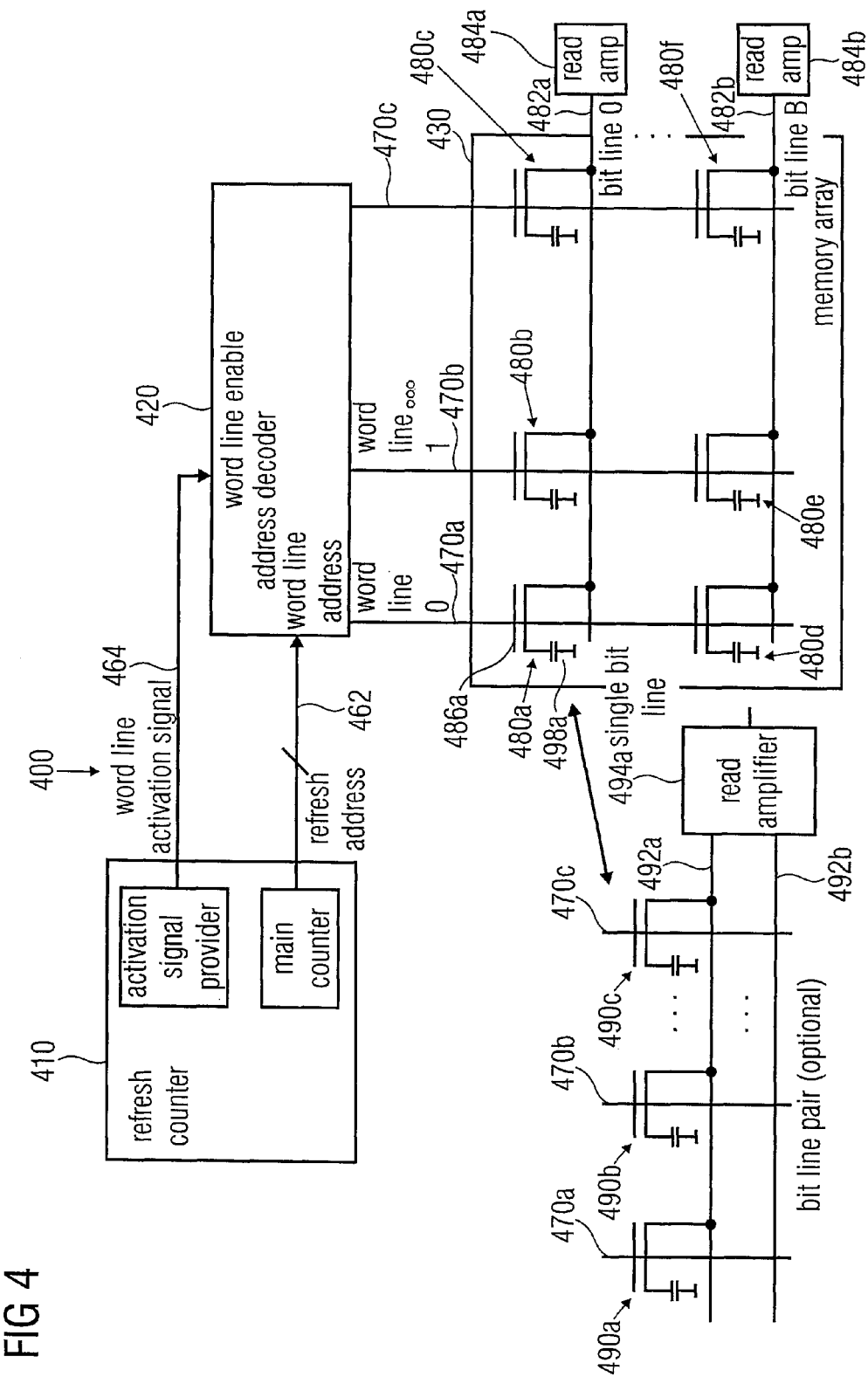
FIG. 4 shows an extract of a block schematic diagram of a chip, according to another embodiment.

FIG. 4 shows an extract of a block schematic diagram of a chip, according to another embodiment. The block schematic diagram shown in FIG. 4 is designated in its entirety with 400. The block schematic diagram 400 shows a refresh counter 410, which may be identical to one of the refresh counters 110, 230, 300, 394 described with reference to FIGS. 1, 2, 3a and 3b. Moreover, the block schematic diagram of FIG. 4 shows an address decoder or word line selector 420. The address decoder or word line selector 420 may, for example, be identical to the word line selector 260 shown in FIG. 2. The block schematic diagram 400 shows a memory array 430, which may, for example, be identical to one of the memory arrays 120, 272 shown in FIGS. 1 and 2.

The refresh counter 410 may be configured to provide a refresh address information 462, the refresh address information 262 or the refresh address information 362. The refresh counter 410 may also be configured to provide a word line activation signal 464, which may, for example, be identical to the word line activation signal 264 shown in FIG. 2 or the word line activation signal 364 shown in FIGS. 3a and 3b.

For example, the refresh counter 410 may comprise a main counter and an activation signal provider to provide the refresh address information 462 and the word line activation signal 464, respectively. For details, reference may be taken to the description of FIGS. 3a and 3b.

The address decoder or word line selector 420 comprises a word line address input for receiving the refresh address information 462. Moreover, the address decoder or word line selector 420 comprises a word line enable input for receiving the word line activation signal 464. The address decoder or word line selector 420 may be configured to provide a plurality of word line signals 470a, 470b, 470c, which may be identical to the word line signals 270a, 270b, 270c described with reference to FIG. 2.

The memory array 430 comprises a plurality of memory cells 480a to 480f. The memory cells 480a to 480f may, for example, be organized in the form of a matrix, which may comprise rows and columns.

In the following, memory cells coupled to the same word line will be considered to belong to the same row. Memory cells coupled to the same bit line may be considered to belong to the same column. However, it should be noted that this is more or less an arbitrary convention, which could be exchanged by another definition.

According to the above-mentioned convention, memory cells 480a and 480d can be considered to belong to the same row, namely to a row coupled to the first word line 470a. Memory cells 480b, 480e can be considered to belong to another row, namely to the row connected to the second word line 470b. Memory cells 480c and 480f can be considered to belong to another row, namely to the row coupled to the word line 470c. Memory cells 480a, 480b and 480c are all coupled to a first bit line 482a, and may therefore be considered as belonging to the same column. Memory cells 480d, 480e and 480f are coupled to another bit line, for example to a second bit line 482b. Thus, memory cells 480d, 480e and 480f may be considered as belonging to the same column.

The first bit line 482a may, for example, be coupled to a first read amplifier (or sense amplifier) 484a. The second bit line 482b may, for example, be coupled to a second read amplifier 484b. Different types of read amplifiers or sense amplifiers may be used here, which are also well known to someone skilled in the art.

The memory cells 480a to 480f may, for example, have a similar or identical structure. In the following, the structure of only a single one of the memory cells 480a to 480f will be described. For example, the memory cell 480a may comprise a field-effect transistor 486a. A gate electrode of the field-effect transistor 486a may, for example, be coupled to a corresponding word line, for example, to the first word line 470a. A first channel electrode of the field-effect transistor 486a may be coupled to a storage capacitor 488a. A second channel electrode of the field-effect transistor 486a may be coupled to the corresponding bit line, for example, to the first bit line 482a, as shown in FIG. 4. Regarding the other memory cells, the configuration can be seen in FIG. 4.

It should be noted that in an embodiment, one out of the word lines 470a, 470b, 470c may be activated once per activation of the word line activation signal 464. The address decoder 420 may select which of the word lines 470a, 470b, 470c is activated in dependence on the refresh address information 462.

In an embodiment, an activation of the word line activation signal 464 may effect an activation of one of the word lines 470a, 470b, 470c, such that as a consequence, a row of memory cells (for example, a first row comprising the memory cells 480a, 480d, a second row comprising the memory cells 480b, 480e, or a third row comprising the memory cells 480c, 480f) is coupled to the bit lines 482a, 482b and thus refreshed. In other words, in an embodiment, each activation of the word line activation signal 464 may result in a refresh of a row of memory cells.

It should be noted here that further logic and/or timing generation may be present in some embodiments, for example in order to control or drive the read amplifiers 484a, 484b. For the sake of simplicity, such circuitry has not been shown in FIG. 4.

It should be noted here that the memory array 430 could be modified significantly. For example, the bit lines 482a, 482b shown in FIG. 4 could be replaced by a pair of bit lines in order to obtain a balanced or symmetric circuit.

An additional bit line of the pair of bit lines may, for example, serve as a dummy bit line. FIG. 4 shows such an alternative memory cell configuration, which may optionally be used. For example, the bit line 482a (also designated as first bit line or "bit line 0") may be replaced by two bit lines 492a, 492b. The single ended read amplifier 484a may be replaced by a differential read amplifier or sense amplifier 494a. The memory cells 480a, 480b and 480c may be replaced by memory cells 490a, 490b and 490c. The memory cells 490a, 490b, 490c may be coupled to the word lines 470a, 470b, 470c. As can be seen from FIG. 4, the bit line 492b may be a dummy bit line. However, there are some embodiments in which the bit line 492b may be connected to some memory cells also.

Regarding the circuit shown in FIG. 4, it should be noted that many details have been omitted, which have already been explained with reference to FIGS. 1, 2, 3a and 3b.

Also, other details, like, for example, the read amplifiers, the column selection, have been omitted for the sake of simplicity.

FIG. 5 shows a block schematic diagram of a multi-chip system. The multi-chip system shown in FIG. 5 is designated in its entirety with 500.

The multi-chip system 500 comprises a plurality of chips (for example, at least two chips). A first chip (also designated as "chip 0") is designated with 510, a second chip (also designated as "chip 1") is designated with 520, and an i-th chip (also designated as "chip (i−1)") is designated with 530. A multi-chip system 500 may comprise two or more of the chips 510, 520, 530 shown in FIG. 5.

The chips 510, 520, 530 may, for example, comprise the features described with reference to FIG. 1, FIG. 2, FIG. 3a, FIG. 3b and FIG. 4. For example, the first chip 510 may comprise a command decoder 540, which may, for example, have the functionality of the command decoder 210. The first chip 510 may optionally comprise a self-refresh oscillator 544, which may, for example, be identical to the optional self-refresh oscillator 224. The first chip 510 may comprise a refresh counter 550, which may, for example, fulfill the functionality of the refresh counter 230. The refresh counter 550 may, for example, comprise the functionality or structure described making reference to FIGS. 3a and 3b. The first chip 510 may, for example, comprise a word line selector 554 and a memory array 558. The word line selector 554 may, for example, comprise the functionality of the word line selector 260, and the memory array 558 may, for example, comprise the functionality of the memory array 272.

The first chip 510 may further comprise a total chip count provider 562. The total chip count provider 562 may, for example, fulfill the functionality of the refresh interval provider 240 and provide to the refresh counter 550 an information about a refresh interval. The total chip count provider 562 may, for example, be configured to provide to the refresh counter 550 an information describing a total number of chips which are coupled to form a logic memory unit. For example, the total chip count provider 562 may provide to the refresh counter 550 an information describing a number of chips which are coupled to form a multi-chip-system or a chip stack, which multi-chip system or chip stack may, for example, present to its environment some characteristics of a single chip. For example, the total chip count provider 562 may provide to the refresh counter 550 an information about a number of chips sharing a chip select signal.

The total chip count provider 562 may use one out of a plurality of different methods to provide the refresh interval information to the refresh counter. For example, the total chip count provider 562 may comprise a one or more mask programmable, one-time programmable or reprogrammable memory cells, which are configured to store the refresh interval information or the total chip count information. Alternatively, the total chip count provider 562 may, for example, comprise a dynamic means for determining, how many chips are combined to form, for example, a logic memory unit.

If a one-time programmable or reprogrammable memory element is used for storing the refresh interval information or the total chip count information, this one-time programmable or reprogrammable storage element (e.g., a fuse, an anti-fuse, a PROM cell, an EPROM cell, an EEPROM cell, a flash cell) may, for example, be programmed when the chip (e.g., the first chip 510) is tested.

The first chip 510 (or any other of the chips) may further, optionally, comprise a chip-ID-provider or a self-enumerator 566. The chip-ID-provider or self-enumerator 566 may, for example, be coupled to the refresh counter 550 in order to provide the refresh counter 550 with a chip ID information or a self-enumeration information, which may serve as a refresh offset information.

In an embodiment, the chip-ID-provider 566 may comprise a memory element or storage element configured to store the chip ID-information and/or the refresh offset information. For example, the chip-ID-provider may comprise a mask programmable, one-time programmable or reprogrammable storage element or memory element configured to store an information describing a refresh offset, i.e., a timing of the word line activation signal provided by the refresh counter 550. If the refresh-ID-provider 566 comprises a one-time programmable or reprogrammable memory element or storage element, the memory element or storage element may, for example, be programmed when the first chip 510 is tested.

In an alternative embodiment, the chip-ID provider may be configured as a self-enumerator. In other words, the chip-ID provider may be configured to provide a chip-ID uniquely identifying the first chip 510 (for example, among a plurality of coupled chips forming a multi-chip system) at runtime. For example, the first chip 510 may be coupled to the second chip 520. The coupling may in some embodiments be used for an automatic allocation of chip-identification information to the different chips 510, 520. For example, the chip identification provider 566 may be configured to recognize the presence of another chip belonging to the same logical memory unit or multi-chip system. The chip identification provider 566 may further be configured to derive the chip identification of the chip 510 from information obtained from another chip, for example, from the second chip 520. For example, the second chip 520 may provide an information to the first chip 510 indicating that the second chip has a chip identification number of 2. The first chip 510 may then derive therefrom that the first chip 510 should be given the chip identification number 1. In an alternative embodiment, the second chip 520 may provide an information indicating that the next chip coupled to the second chip 520 should have the chip identification number 1. In this case, the chip identification provider 566 of the first chip 510 may receive this information and allocate to the first chip 510 the chip identification number (e.g., the number "1").

Thus, the chip identification provider 566 may in some embodiments be configured in order to provide a chip identification number to the chip 510 based on knowledge about the presence of additional chips, which may, for example, be part of the same logic memory unit or multi-chip-system. Thus, the chip identification provider 566 may be configured such that different chip identification numbers are associated to a plurality of coupled (e.g., identical) chips.

In some embodiments, the first chip 510 may be configured to determine the timing of the word line activation signal in dependence on the chip identification number provided by the chip identification provider 566 to the refresh counter 550.

In general, the chips 510, 520, 530 may, for example, have the overall functionality described with reference to the chip 200 shown in FIG. 2.

The chips 510, 520, 530 may, for example, form a logical memory unit. For example, the first chip 510, the second chip 520 and the third chip 530 may be connected to one or more control signals in parallel. For example, the command decoder 540 of the first chip 510, a command decoder 570 of the second chip 520 and a command decoder 572 of the third chip 530 may be coupled in parallel to receive one or more common control signals. In an embodiment, the command decoder 540 of the first chip 510, the command decoder 570 of the second chip 520 and the command decoder 572 of the third chip 530 may be configured to receive the same row address select or row address strobe signal, the same column address select or column address strobe signal and/or the same chip select signal. In an embodiment, the command decoders of the chips 510, 520, 530 may be coupled to receive the same row address select signals (RAS), the same column address select signals (CAS) and the same chip select signals (CS). In such a case, the first chip 510, the second chip 520 and the third chip 530 may all receive the same commands encoded by the row address select signal (RAS), the column address signal (CAS) and the chip select signal (CS). For example, the control signals RAS, CAS and CS may be capable to encode a read command, a write command and a refresh command. Optionally, the command signals may also be configured to encode a self-refresh activate command and/or self-refresh deactivate command. Thus, as the command decoders of the first chip 510, the second chip 520 and the third chip 530 are coupled to the same control line or control lines (e.g., RAS, CAS, CS), the first chip 510, the second chip 520 and the third chip 530 may receive the same commands, which may naturally be time-shifted slightly due to (unavoidable) propagation delays.

Figure 6A:
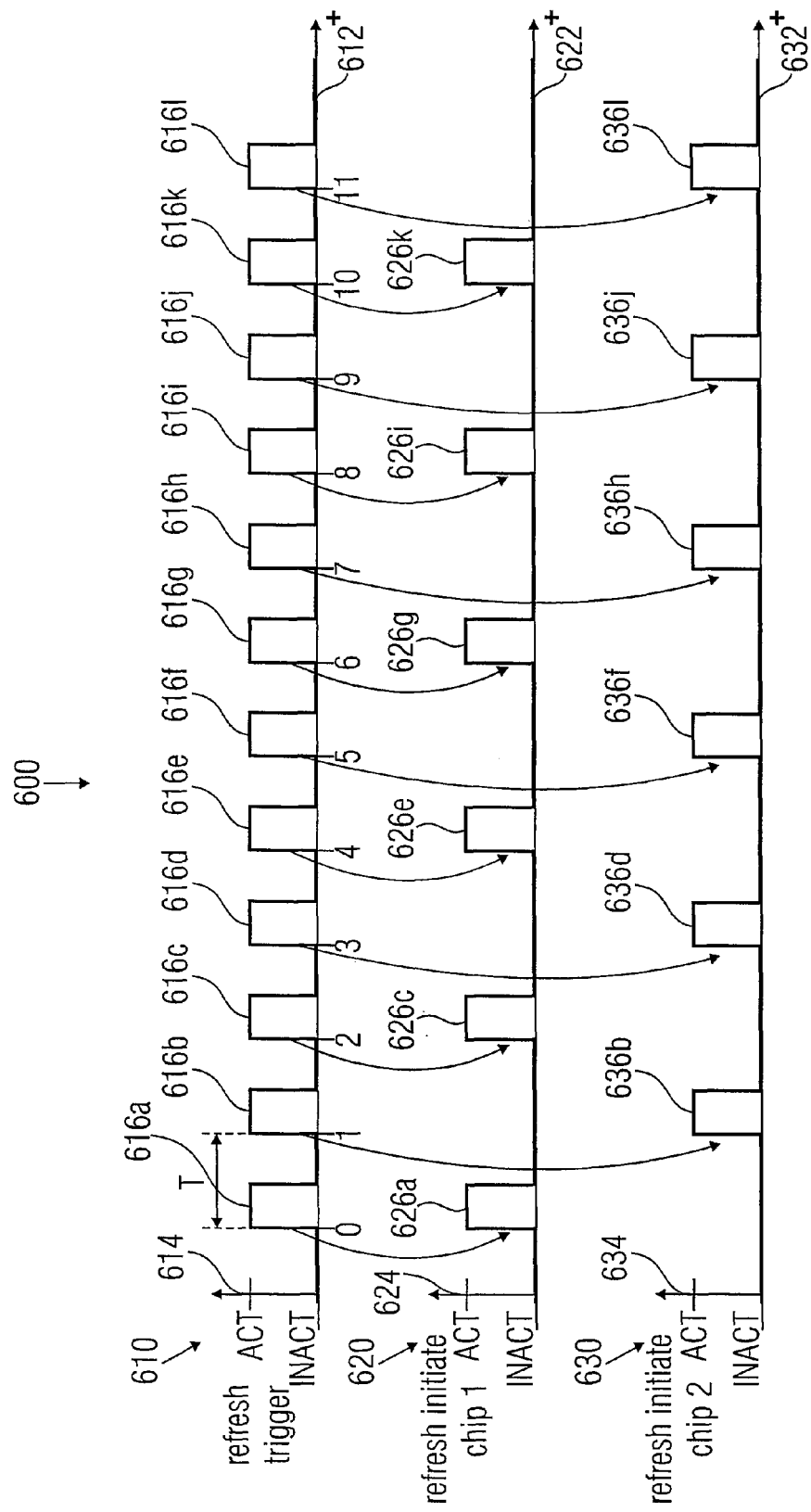
FIG. 6a shows a graphical representation of signals, which may be present in a multi-chip system according to an embodiment.

In the following, the functionality of the multi-chip system 500 will be described. For this purpose, FIG. 6a shows a graphical representation of signals, which may be present in the multi-chip system 500 of FIG. 5. However, for the sake of simplicity, it is assumed first that there are only two chips involved, namely the first chip 510 and the second chip 520. In other words, it is assumed that the third chip 530 is not present, or is not considered.

The graphical representation of FIG. 6a is designated in its entirety with 600. A first signal representation 610 illustrates refresh trigger signals. An abscissa 612 describes the time, and an ordinate 614 describes the activity of the refresh trigger signals. In other words, the abscissa 614 describes whether the refresh trigger signals are inactive (INACT) or active (ACT).

A second signal representation 620 describes an activity of refresh initiation signals for the first chip (e.g., the chip 510). An abscissa 622 describes the time, and an ordinate 624 describes the activity of refresh initiation signals (e.g., of the word line activation signals) for the first chip 510.

A third signal representation 630 describes an activity of a refresh initiation signals of the second chip (e.g., the chip 520). An abscissa 632 describes the time, and an ordinate 634 describes the activity of the refresh initiation signals for the second chip 520, (e.g., an activity of the word line activation signals) for the second chip 520.

In an embodiment, the refresh trigger signals, e.g., represented by 12 activity pulses shown in the first signal representation 610, are at least approximately identical in the first chip 510 and in the second chip 520. In other words, the refresh counter 550 of the first chip 510 receives approximately the same refresh trigger signals as the refresh counter of the second chip 520. The refresh trigger signals received by the refresh counter of the first chip 510 may, for example, be time-shifted with respect to the refresh trigger signals received by the refresh counter of the second chip 520 by typically less than a quarter of a time T between subsequent of the refresh trigger signals.

The first signal representation 610 shows 12 activity pulses representing 12 refresh trigger signals. The refresh trigger signals are designated with 616a to 616l. The second signal representation 620 shows signals for initiating an actual refresh of the memory array 558 of the first chip. This refresh initiation signals are designated with 626a, 626c, 626e, 626g, 626i, 626k. The third signal representation shows refresh initiation signals 636b, 636d, 636f, 636h, 636j and 636l for initiating an actual refresh of a memory array of the second chip.

Taking reference to the second signal representation 620, it can be noted that a refresh initiation signal 626a, 626c, 626e, 626g, 626i, 626k initiating a refresh of the memory array 558 of the first chip 510 is generated once per two of the refresh trigger signals 616a to 616l. Taking reference to the third signal representation 630, it can be seen that a refresh initiation signal 636b, 636d, 636f, 636h, 636j and 6361 for initiating a refresh operation of the memory array of the second chip 520 is generated once per two of the refresh trigger signals 616a to 616l.

In the embodiment described here, the refresh initiation signals for triggering a refresh of the memory array 558 of the first memory 510 are (intentionally) shifted in time with respect to the refresh initiation signals for triggering a refresh of the memory array of the second chip 520 approximately by the time T between subsequent refresh trigger signals.

In other words, a refresh of the memory array of the first chip 510 may, for example, be initiated in response to refresh trigger signals 616a, 616c, 616e, 616g, 616i, 616k having an even time index (e.g., time index 0, 2, 4, 6, 8 or 10). A refresh of the memory array of the second chip 520 may, for example, be initiated in response to refresh trigger signals 616b, 616d, 616f, 616h, 616j, 616l having odd time index (e.g. 1, 3, 5, 7, 9, 11).

FIG. 6b shows a graphical representation of signals which may be present in some other embodiments of the multi-chip system. The graphical representation of FIG. 6b is designated in its entirety with 650.

The graphical representation 650 comprises a first signal representation 660 showing the refresh trigger signals. The first signal representation 660 comprises an abscissa 662 describing the time (for example, in terms of normalized time units) and an ordinate 664 describing an activity or inactivity of the refresh trigger signals. Moreover, refresh trigger signals 666a to 666m, which are numbered in an arbitrary way by subsequent time indices 0 to 12 are shown along the abscissa 662.

A second signal representation 670 describes an activity of refresh initiation signals for a first chip. An abscissa 672 describes the time, and an ordinate describes the activity of the refresh initiation signals for the first chip, for example, for the first chip 510.

A third signal representation 680 describes an activity of refresh initiation signals for a second chip, for example, for the chip 520. An abscissa 682 describes the time, and an ordinate 684 describes the activity of the refresh initiation signals for the second chip.

A fourth signal representation 690 describes an activity of refresh initiation signals for a third chip, for example, for the third chip 530. An abscissa 692 describes the time, and an ordinate 694 describes an activity of the refresh initiation signals.

A fifth signal representation 696 describes an activity of refresh initiation signals for a fourth chip. For example, the multi-chip system 500 shown in FIG. 5 may be supplemented by a fourth chip not shown in FIG. 5, such that the four chips may, for example, form a single logical memory unit. An abscissa 697 describes the time, and an ordinate 698 describes the activity of the refresh initiation signals for the fourth chip.

Regarding the signals shown in FIG. 6b, the signals may, for example, occur in a system in which four chips are combined to form a multi-chip system. For example, the four chips may form a memory having a capacity which is four times the memory capacity provided by a single chip.

However, the individual chips may be actually refreshed once per four of the refresh trigger signals, as can be seen from the signal representations 660, 670, 680, 690 and 696 of FIG. 6b. For example, a refresh of the first chip (e.g., of the chip 510), or of the memory array thereof, may be initiated in response to the first active refresh trigger signal 666a (having time index 0), in response to the fifth refresh trigger signal 666e (having time index 4), in response to the ninth refresh trigger signal 666i (having time index 8) and in response to the thirteenth refresh trigger signal 666m (having time index 12). Similarly, the second chip (for example, the chip 520) may be refreshed in response to the second refresh trigger signal 666b (having time index 1), the sixth refresh trigger signal 666f (having time index 5) and in response to the tenth refresh trigger signal 666j (having time index 9). A refresh of the third chip (e.g., of the chip 530) may be initiated in response to the third refresh trigger signal 666c (having time index 2), in response to the seventh refresh trigger signal 666g (having time index 6) and in response to the eleventh refresh trigger signal 666k (having time index 10).

A refresh of the fourth chip (not shown in FIG. 5) may be initiated in response to the fourth refresh trigger signal 666d (having time index 3), in response to the eighth refresh trigger signal 666h (having time index 7) and also in response to the twelfth refresh trigger signal 666l (having time index 11).

Thus, it can be seen that an initiation of a refresh of the second chip (e.g., the chip 520) may be shifted in time with respect to an initiation of a refresh of the first chip (e.g., the chip 510) by one active refresh trigger signal. Similarly, an initiation of a refresh of the third chip (e.g., the chip 530) may be shifted with respect to an initiation of a refresh of the second chip (e.g., the chip 520) by one active refresh trigger signal. Also, an initiation of a refresh of a fourth chip (not shown in FIG. 5) may be shifted with respect to an initiation of a refresh of the third chip (the chip 530) by one active refresh trigger signal.

Details regarding the time shift of the initiation of the refresh of the individual chips can be seen from FIG. 6b.

Naturally, the refresh described with respect to FIGS. 6a and 6b can be changed in many ways. For example, an arbitrary number of chips can participate. For example, two or more chips can be combined to form a multi-chip system. In some embodiments, the number of chips is a power of 2, e.g., 2, 4, 8, 16, 32, 64 and so one. However, a different number can be chosen.

In some embodiments, if the multi-chip system comprises i chips, a refresh of an individual chip may be initiated once per i of the refresh trigger signals. However, other configurations may be chosen. In some embodiments, if a multi-chip system comprises i chips, a refresh of a particular chip may be initiated, for example, once per i/2 of the refresh trigger signals, or once per 2·i of the refresh trigger signals. However, other ratios between the number of chips and the refresh initiation period for a single chip (measured, for example, in terms of active refresh trigger signals) may be chosen.

Also, there are some embodiments, in which two or more of the chips forming a multi-chip system may be refreshed substantially simultaneously.

In some embodiments, a time shift between the initiations of refreshes for two different chips may be larger than one active refresh trigger signal. For example, a time shift between an initiation of the refresh of two adjacent chips of a multi-chip system may be two or three refresh trigger signals (or two or three times a time between adjacent refresh trigger signals).

From the above, it can be seen that there are many possibilities to modify the refresh timing of multiple chips forming the multi-chip system. Thus, each of the embodiments described above should be seen as examples of possible implementations only.

Taking reference again to FIG. 5, the functionality of the self-refresh will subsequently be described. In some embodiments, each of the chips 510, 520, 530 may comprise its own self-refresh oscillator (e.g., the self-refresh oscillator 544). The self-refresh oscillators of the chips 510, 520, 530 may, for example, be free-running oscillators, and may therefore have slightly different frequencies. Moreover, the self-refresh oscillators may be configured to provide refresh trigger signals to the refresh counter 550. In a self-refresh mode of operation of the chips, these refresh trigger signals may, for example, serve to operate the refresh counter.

In some other embodiments, the refresh counter may be configured to distinguish refresh trigger signals provided by the command decoder from refresh trigger signals provided by the self-refresh oscillator. In one embodiment, the refresh counter 550 may be configured to provide a refresh initiation signal (e.g., in the form of a word line activation signal) to the word line selector 554 to thereby initiate a refresh of the memory array, in response to each refresh trigger signal provided by the self-refresh oscillator 544 in the self-refresh mode of operation. In contrast, the refresh counter 550 may still be configured to provide a refresh initiation signal to the word line selector 554 to thereby initiate a refresh of the memory array only once per i of the refresh trigger signals provided by the command decoder in the non-self-refresh mode of operation.

In some other embodiments, the refresh counter 550 may be configured to treat refresh trigger signals provided by the command decoder and refresh trigger signals provided by the self refresh counter in the same way. For example, the self refresh counter may be configured to initiate a refresh of the memory array once per i of the refresh trigger signals provided by the command decoder and once per i of refresh trigger signals provided by the self-refresh oscillator.

However, in some embodiments, the refresh counter may be switchable between the different modes.

In other words, in some embodiments, the refresh counter 550 may be configured to initiate a refresh of the memory array once per i of the refresh trigger signals provided by the command decoder (for example, based on a decoding of commands) and also once per i of the refresh trigger signals provided by the self-refresh oscillator.

However, in another embodiment, the refresh counter may be configured to initiate a refresh of the memory array once per i of the refresh trigger signals provided by the command decoder and once per n of the refresh trigger signals provided by the self-refresh oscillator. In some embodiments, the value of i may be different from the value of n. In some embodiments, one out of the values of i and n may be identical to 1, and one out of the values of i and n may be greater than 1.

In other words, there is an embodiment in which the refresh counter is configured to initiate a refresh of the memory array once per i of the refresh trigger signals provided by the command decoder (wherein i is greater than 1), and to initiate a refresh of the memory array in response to each of the refresh trigger signals provided by the self-refresh oscillator (provided that the chip is in a self-refresh mode of operation). In other words, the refresh counter may be configured in an embodiment such that a desired refresh rate for the memory array may be reached by a first rate of refresh trigger signals provided by the command decoder, or, alternatively, by a second rate of refresh trigger signals provided by the self-refresh oscillator, wherein the first rate is different from the second rate.

To summarize the above, there are some embodiments in which a given refresh rate of the memory array can be achieved either by refresh commands provided to the chip externally at the first rate, or by refresh trigger signals generated by an on-chip self-refresh oscillator at the second rate. The first rate can be different from the second rate.

However, in some other embodiments, the refresh counter may be configured such that refresh trigger signals provided by the command decoder are treated in the same way as refresh trigger signals provided by the self-refresh oscillator with respect to a rate of refresh operations performed on the memory array.

In the following, some embodiments will be discussed in which there is an optional synchronization of a self-refresh rate between a plurality of chips. In some embodiments, it may be desirable to have identical memory array refresh rates in a self-refresh mode of operation. This is due to the fact that in some embodiments it is possible to obtain a synchronization of a power consumption of a plurality of chips if the refresh counters of different chips are operated by time-synchronized refresh trigger signals. For example, if four chips are operated with identical (or at least synchronized) refresh trigger signals, a timing can be achieved which is shown in FIG. 6b. In FIG. 6b, it can be seen that a refresh of the individual chips (also designated as "chip 1", "chip 2", "chip 3" and "chip 4") is shifted in time. Thus, the different chips involved in the synchronized refresh operation have a synchronized power consumption, wherein different chips exhibit their maximum power consumption at different times. Thus, in some embodiments, it can be avoided that all of the chips have simultaneous power consumption peaks (which may, for example, be caused by the initiation of a refresh of a memory array).

Thus, a more uniform power consumption of the different chips can be achieved by operating a plurality of chips on the basis of common or synchronized refresh trigger signals. Obtaining such synchronization may in some embodiments be desirable in a self-refresh mode of operation. Thus, there may be an optional coupling between self-refresh circuits of different chips of a multi-chip system. For example, in a multi-chip system comprising two or more chips, one of the chips may be configured as a self-refresh master chip, and the other chips may be configured as self-refresh slave chips. A self-refresh oscillator of the self-refresh master chip may be configured to provide refresh trigger signals for the refresh counter of the master chip, may also be configured to provide refresh trigger signals for the refresh counters of the slave chips. In the embodiment shown in FIG. 5, the self-refresh oscillator 544 of the first chip 510 may for example, be configured to provide refresh trigger signals to the refresh counter 550 of the first chip 510, and may further be configured to provide refresh trigger signals for a self refresh of the second chip 520 and of the third chip 530.

Naturally, there are different possibilities as to which kind of signal may be exchanged by the different chips. For example, the self-refresh oscillator 544 of the first chip 510 may provide to the second chip 520 and the third chip 530 a self refresh synchronization signal. Thus, the self-refresh oscillator 580 of the second chip 520 may be configured to synchronize to the self refresh synchronization signal provided by the self-refresh oscillator 544 of the first chip 510. Also, the self-refresh oscillator 584 of the third chip 530 may be configured to receive the self refresh synchronization signal provided by the self-refresh oscillator 544 of the first chip 510 and to synchronize the generation of refresh trigger signals to the synchronization signal.

For the sake of synchronization, a phase-locked loop or any other suitable synchronization mechanism may be used.

However, in another embodiment, the self-refresh oscillators 580, 584 of the second chip 520 and the third chip 530 may be deactivated if the second chip 520 and the third chip 530 are part of a multi-chip system, in which there is a self-refresh master chip (for example, the first chip 510). In this case, the self-refresh master chip (e.g., the first chip 510) may provide to the self-refresh slave chip or to the self-refresh slave chips (for example, the second chip 520 and the third chip 530) a refresh trigger signal, which may (for example, directly) be fed to the refresh counters of the self-refresh slave chips (the second chip 520 and the third chip 530).

Thus, the self-refresh master chip and the one or more self-refresh slave chips may be operated on the basis of identical self-refresh trigger signals (which may, however, comprise a moderate time shift due to unavoidable transmission line propagation delays).

However, it should be noted that a synchronization of a self refresh is not necessary in multi-chip systems. Rather, such synchronization should be considered an optional feature.

Figure 7:
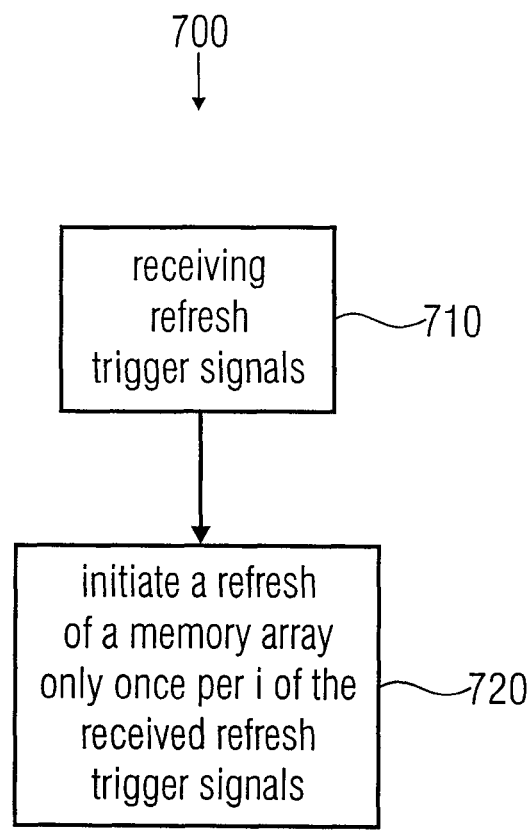
FIG. 7 shows a flow chart of a method, according to an embodiment.

FIG. 7 shows a flow chart of a method for performing a refresh of a memory array. The method shown in FIG. 7 is designated in its entirety with 700. The method 700 comprises receiving 710 refresh trigger signals. The method further comprises initiating 720 a refresh of a memory array only once per i of the received refresh trigger signals where i is greater than 1.

The method 700 can optionally be supplemented by any of the features described herein. Also, the method 700 can optionally be extended for usage in a multi-chip system, as described herein. Moreover, the method 700 can optionally be implemented by a computer program, which may, for example, be performed by a micro-programmable control unit of a chip.

Depending on certain implementation requirements of the inventive method, the inventive method can optionally be implemented in hardware or in software. The implementation can be performed using a digital storage medium, for example, a floppy disk, a DVD, a CD, a ROM, a PROM, an EPROM, an EEPROM or a FLASH memory having electronically readable control signals stored thereon, which cooperate with a programmable computer system such that the inventive method is performed. Generally, the present invention is, therefore, a computer program product with a program code stored on a machine readable carrier, the program code being operative for performing the inventive method when the computer program product runs on a computer. In other words, the inventive method is, therefore, a computer program having a program code for performing the inventive method when the computer program runs on a computer.

In the following, some further details regarding some embodiments of the present invention will be described. In some embodiments of the invention, the refresh counter (for example, the refresh counter 110, the refresh counter 230, the refresh counter 300, the refresh counter 394, the refresh counter 410 or the refresh counter 550) may be configured as a programmable refresh counter. In some embodiments, the refresh counter may be configured to be programmable in dependence on a stacking height, for example, on a stacking height of chips forming a multi-chip system. In other words, some embodiments of the invention create a programmable refresh counter with a dependency on stacking height.

Some embodiments of the present invention therefore provide a refresh counter that considers a stacking configuration (e.g., a stacking configuration of several chips) and that counts accordingly.

Some embodiments of the refresh counter may be used in a stacked DRAM that creates a monolithic device (for example, instead of today's multi-rank stack). Some stacked DRAMs that create a monolithic device may, for example, be operated using a special refreshing scheme. For example, a stack may be formed of (a plurality of) standard DRAMs. For example, DRAMs having capacity of approximately 1 Gb may be used. For example, four of these DRAMs may create a stack having a memory capacity of approximately 4 Gb. If a refresh command is sent to the stack (e.g., via command lines RAS, CAS and/or CS), each of the DRAMs (e.g., each of the DRAMs having a capacity of 1 Gb) may get the command. Conventionally, each of the DRAMs may therefore perform a refresh.

However, for a 4 Gb device, refreshes may be sent more frequently. In other words, if the memory controller recognizes that a device provides a memory capacity of 4 Gb, the memory controller may, for example, provide refresh commands more frequently than in a situation in which a device capacity (or memory capacity) of 1 Gb is detected. Therefore, the DRAMs (e.g., the four 1 Gb DRAMs forming together a 4 Gb memory) may conventionally perform (or do) too many refreshes.

According to some embodiments, the refresh counter is programmable. For example, for a 2-high stack (i.e., for a stack having a height of 2), it receives the refresh command, but executes only each second refresh. In another example, for a 4-high stack (i.e., a stack of height 4), it only executes every fourth refresh command.

In some embodiments, the executed refresh commands may be staggered in order to reduce the current. For example, for a 2× stack (i.e., a stack comprising 2 devices or chips), a bottom device may execute each even refresh (2, 4, 6, . . . ). The top device may execute only each odd refresh command (1, 3, 5, . . . )

Some embodiments of the invention create a programmable refresh counter based on a number of devices in a stack and a location for staggering.

Some embodiments of the refresh counter described herein may be applied in dynamic random access memory (DRAM) devices. Some other embodiments of the refresh counter described herein may be applied in array-stacked devices. Naturally, the method described herein may also be applied in the devices.

Some embodiments may, for example, create a refresh counter dependent on a stacking height of master slave (monolithic) stacked DRAMs.

According to some embodiments, the command lines may comprises a row address select line (RAS), a column address select line (CAS) and a write enable line (WE) or a chip select line (CS).

According to some embodiments, an activation of a word line (e.g., of a word line of the memory array) may be suppressed at every second refresh trigger signal (or refresh command).

For this purpose, a pre-divider (also designated as a pre-counter) may be provided in front of a main counter for providing the refresh address in some embodiments. In some embodiments, a word line activation signal can be suppressed at every second refresh trigger signal (or at every second refresh command) or at (i−1) out of i refresh trigger signals or refresh commands (with i greater than 1). The refresh counter may, for example, provide a refresh address, which may represent a row address. In addition, the refresh counter may be configured to provide an activation signal, for example, the word line activation signal described above.

In some embodiments, an external refresh command, which may be received via external command lines connected to the chip, may be distinguished from an internal refresh activation command. The internal refresh activation command may, for example, comprise an address of a word line to be activated (or powered up). The internal refresh activation command may further, for example, comprise a signal (for example, the word line activation signal) indicating that a word line selected by the refresh address or row address should actually be activated. In an embodiment, an activation of the word line may effect a connection between a memory cell and a bit line, for example, by switching on a field effect transistor.

In some embodiments, a refresh interval for a total number of chips forming a chip stack may, for example, be stored on the chip using one or more electronic fuses (also designated as "effuse"). Besides a chip identification number, which may, for example, serve as a refresh offset information, may also be stored on a chip using an electronic fuse. The electronic fuses may, for example, be programmed when the respective devices are tested, for example, individually or as a chip stack.

In some embodiments, a synchronization of several chips forming a multi-chip system may be effected at power up. For example, a specific sequence of external control signals may be used in order to synchronize the chips forming the multi-chip system (for example, the chip stack). Alternatively, a time at which the supply voltage of the chips reaches a certain threshold may be used for a synchronization of the chips, for example, alone or taken in combination with a clock signal.

In an embodiment, a rate at which a self-refresh oscillator provides refresh trigger signals may be higher than a rate necessary to properly refresh the memory array of a chip. However, in such an embodiment, the refresh counter may be configured such that a refresh of the memory array of the chip is initiated only once per i of the refresh trigger signals generated by the self-refresh oscillator. In this case, the rate of refresh trigger signals provided to the refresh counter by the self-refresh oscillator may, for example, be i-times higher than a rate of refresh events for properly refreshing the memory array. In other words, the refresh counter may in an embodiment be configured to use only every i-th refresh trigger signal to initiate an actual refresh of the memory array, even in combination with the refresh oscillator.

In some embodiments, a single master oscillator may be used to control a self-refresh of multiple chips. However, in some alternative embodiments, individual self-refresh oscillators may be used.

To summarize the above, multiple embodiments of a chip, a multi-chip system and a method for refreshing a chip have been described. However, the embodiments described above should not be considered as limiting the scope of protection. Rather, the features described above should be considered as examples for possible implementations.

Figure 8:
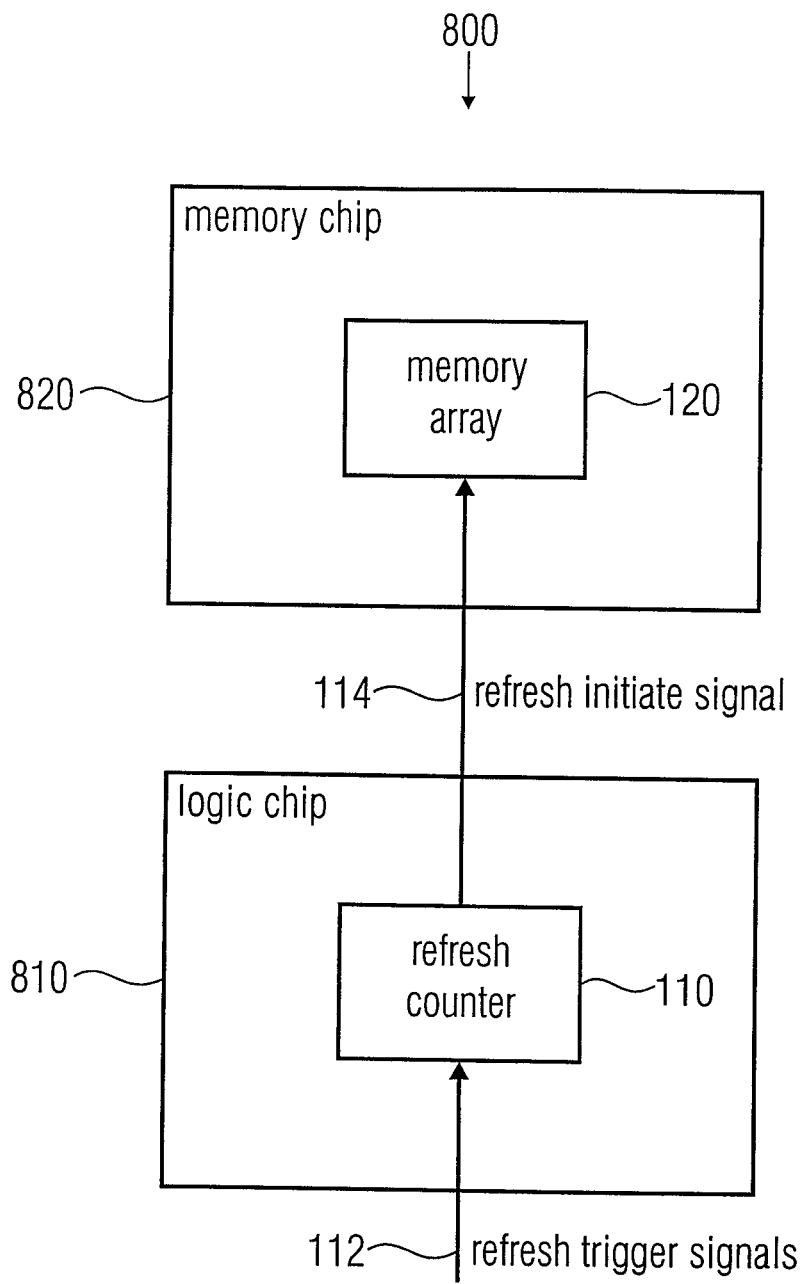
FIG. 8 shows a block schematic diagram of a multi chip system according to an embodiment according to the invention.

Taking reference to FIG. 8, another embodiment according to the invention will be described. The multi-chip system according to FIG. 8 is designated in its entirety with 800. However, means, elements and signals of the multi-chip system 800 are very similar to means, elements and signals of the chip 100. Accordingly, identical reference numerals designate identical means, elements and signals in FIGS. 1 and 8.

However, in the multi-chip system shown in FIG. 8, the refresh counter 110 is arranged on a logic chip 810, while the memory array 120 is arranged on a memory chip 820. In an embodiment, the logic chip and the memory chip may be closely coupled. For example, the memory chip may be stacked on the logic chip, or vice versa.

The logic chip 810 may, for example, comprise an interface logic circuit configured to interface the memory chip with an external environment. For example, the logic chip 810 or the interface logic circuit may comprise one or more unidirectional or bi-directional buffers or drivers.

In some embodiments, the interface logic circuit may be configured to interface multiple memory chips with a common or shared set of external connections. For example, the interface logic circuit may be configured to interface an external environment with one or more common control lines, which are internal to the multi-chip system. The one or more internal common control lines may, for example, connect multiple memory chips, which may be identical to the memory chip 820, with the external environment.

In some embodiments, the interface chip 810 may be fabricated using a different chip technology when compared to the one or more memory chips 820 of the multi-chip system 800. For example, a "logic chip technology", which may be adapted to the needs of the interface circuit (for example to provide a maximum speed or drive capability of a logic circuit), may be used for the logic chip, while a "memory chip technology", which may, for example, be adapted for providing a maximum memory density, may be used for the one or more memory chips.

In some embodiments, the logic chip may comprise more than one refresh counter. For example, each of at least two memory chips coupled to the logic chip (for example, stacked on to the logic chip) may be coupled to individual refresh counters arranged on the logic chip.

However, in some other embodiments, the logic chip may comprise a shared refresh counter configured to provide refresh trigger signals for a memory array of a first memory chip (for example, coupled to the logic chip) and for a memory array of a second memory chip (for example, coupled to the logic chip). For example, the shared refresh counter may be configured to initiate a refresh of the memory array of the first memory chip only once per i of the received refresh trigger signals, wherein i is a number greater than 1, and to initiate a refresh of the memory array of the second memory chip only once per j of the received refresh trigger signals, wherein j is a number greater than 1. The variable i may be identical to the variable j, or different.

What is claimed is:

1. A chip, comprising:
   a memory array; and
   a refresh counter;
   wherein the refresh counter is configured to receive refresh trigger signals at a rate optimal for the memory array,
   wherein the refresh counter is configured or configurable to initiate a refresh of the memory array only once per i of the received refresh trigger signals, and
   wherein i is a number greater than 1; and wherein the refresh counter is programmable such that the value i can be set to at least two different values, wherein at least one of the possible values is greater than 1.

2. The chip according to claim 1, wherein the chip further comprises a command decoder,
   wherein the command decoder is configured to receive one or more command signals capable of encoding different commands,
   wherein the command decoder is configured to identify whether the one or more command signals encode a refresh command, and
   wherein the command decoder is configured to provide a refresh trigger signal to the refresh counter in response to a detection of the refresh command.

3. The chip according to claim 1, wherein the chip further comprises a command decoder;
   wherein the command decoder is configured to receive one or more command signals capable of encoding at least a read command, a write command and a refresh command, and
   wherein the command decoder is configured to provide a refresh trigger signal to the refresh counter in response to a detection of the refresh command.

4. The chip according to claim 1, wherein the chip further comprises a command decoder;
   wherein the command decoder is configured to receive as command signals at least a row address select signal, a column address select signal and a chip select signal, and
   wherein the command decoder is configured to identify a refresh command by evaluating states at least of the row address select signal, the column address select signal and the chip select signal.

5. The chip according to claim 1, wherein the chip further comprises a self-refresh circuit,
   wherein the self-refresh circuit is configured to periodically provide the refresh trigger signals to the refresh counter.

6. The chip according to claim 1, wherein the refresh counter is configured to initiate an activation of a word line of the memory array in order to initiate refresh of the memory array.

7. The chip according to claim 1, wherein the refresh counter is configured to cause a coupling of a memory cell of the memory array to an amplifier in order to initiate a refresh of the memory array.

8. The chip according to claim 1, wherein the refresh counter is configured to provide a refresh address describing a portion of the memory array to be refreshed in a refresh cycle; and
   wherein the chip comprises an address decoder configured to receive the refresh address and to select a portion of the memory array for a refresh operation in dependence on the refresh address.

9. The chip according to claim 8, wherein the refresh address encodes a word line to be activated for a refresh; and
   wherein the address decoder is configured to activate the word line of the memory array encoded by the refresh address in response to the initiation of the refresh by the refresh counter.

10. The chip according to claim 9, wherein the address decoder is configured to activate the word line of the memory array encoded by the refresh address each time the refresh counter initiates the refresh of the memory array.

11. The chip according to claim 8, wherein the refresh counter is configured to modify the refresh address only once per i of the received refresh trigger signals.

12. The chip according to claim 1, wherein the refresh counter comprises a pre-counter configured to receive the refresh trigger signals as pre-counter clock pulses and to provide a pre-counter output signal such that an activation rate of the pre-counter output signal is 1/i of an activation rate of the received refresh trigger signal, and
    wherein the refresh counter is configured to initiate the refresh of the memory array in response to the pre-counter output signal.

13. The chip according to claim 12, wherein the refresh counter comprises a main counter configured to provide a refresh address describing a portion of the memory array to be refreshed in a refresh cycle, and
    wherein the main counter is configured to be driven by the pre-counter output signal.

14. The chip according to claim 12, wherein the refresh counter is configured to initiate a refresh of the memory array as often as the pre-counter output signal is activated.

15. A chip, comprising
    a memory array; and
    a refresh counter;
    wherein the refresh counter is configured to receive refresh trigger signals at a rate optimal for the memory array,
    wherein the refresh counter is configured or configurable to initiate a refresh of the memory array only once per i of the received refresh trigger signals, and
    wherein i is a number greater than 1 and wherein the refresh counter is configured such that an adjustment can be made in order to determine in response to which out of a plurality of subsequent refresh trigger signals a refresh of the memory array is initiated.

16. The chip according to claim 15, wherein the refresh counter is configured to determine, in response to which out of a plurality of subsequent refresh trigger signals a refresh of the memory array is initiated, in dependence on a chip identification number associated with the chip.

17. The chip according to claim 16, wherein the chip comprises a chip identification number provider configured to provide the chip identification number.

18. A multi-chip system, comprising:
    a first chip comprising a first memory array and a first refresh counter configured to receive a first refresh signal at a rate optimal for the first memory array; and a second chip comprising a second memory array and a second refresh counter configured to receive a second refresh signal at a rate optimal for the second memory array;

wherein the first refresh counter is configured or configurable to initiate a refresh of the first memory array only once per i of the received first refresh trigger signals;

wherein the second refresh counter is configured or configurable to initiate a refresh of the second memory array only once per j of the received second refresh trigger signals;

wherein i is a number greater than 1; and wherein j is a number greater than 1; and wherein the first chip and the second chip are configured such that a refresh of the first memory array of the first chip is shifted in time with respect to a refresh of the second memory array of the second chip by at least one refresh trigger signal activation.

19. The multi-chip system according to claim 18, wherein the first chip and the second chip are both connected to one or more common control lines, wherein the common control lines are internal to the multi-chip system;

wherein the one or more common control lines are configured for providing a synchronization of the first and second refresh trigger signals of the first chip and the second chip.

20. A multi-chip system, comprising:

a first chip comprising a first memory array and a first refresh counter configured to receive a first refresh signal at a rate optimal for the first memory array; and a second chi comprising a second memory array and a second refresh counter configured to receive a second refresh signal at a rate optimal for the second memor arra wherein the first refresh counter is configured or configurable to initiate a refresh of the first memory array only once per i of the received first refresh trigger signals;

wherein the second refresh counter is configured or configurable to initiate a refresh of the second memory array only once per j of the received second refresh trigger signals;

wherein i is a number greater than 1; and wherein j is a number greater than 1 and wherein the first chip and the second chip are configured to have different chip identification numbers; and wherein the first refresh counter of the first chip and the second refresh counter of the second chip are configured to effect a time shift between an initiation of a refresh of the first memory array of the first chip and an initiation of a refresh of the second memory array of the second chip in response to the chip identification numbers of the first chip and the second chip.

21. A chip, comprising:

a memory array;

a command decoder; and a refresh counter;

wherein the command decoder is configured to receive one or more command signals capable of encoding at least a read command, a write command and a refresh command for the memory array;

wherein the command decoder is configured to identify whether the one or more command signals encode a refresh command;

wherein the command decoder is configured to provide a refresh trigger signal at a rate optimal for the memory array to the refresh counter in response to a detection of the refresh command;

wherein the refresh counter is configured to receive the refresh trigger signals;

wherein the refresh counter is configured or configurable to initiate a refresh of the memory array only once per i of the received refresh trigger signals;

wherein i is a number greater than 1;

wherein the refresh counter is programmable such that the value i can be set to at least two different values, wherein at least one of the possible values is greater than 1;

wherein the refresh counter is configured to provide a refresh address describing a portion of the memory array to be refreshed in a refresh cycle;

wherein the refresh address encodes a word line to be activated for a refresh;

wherein the chip comprises an address decoder configured to receive the refresh address and to select a portion of the memory array for a refresh operation in dependence on the refresh address; and wherein the address decoder is configured to activate the word line of the memory array encoded by the refresh address in response to the initiation of the refresh by the refresh counter.

22. A multi-chip system, comprising:

a memory chip; and a logic chip;

wherein the memory chip comprises a memory array;

wherein the logic chip comprises an interface logic circuit;

wherein the interface logic circuit is configured to interface the memory chip with an external environment;

wherein the logic chip comprises a refresh counter configured to receive refresh trigger signals at a rate optimal for the memory array;

wherein the refresh counter of the logic chip is configured or configurable to initiate a refresh of the memory array of the memory chip only once per i of the received refresh trigger signals;

wherein i is a number greater than 1 and wherein the refresh counter is programmable such that the value i can be set to at least two different values, wherein at least one of the possible values is greater than 1.

* * * * *